(12) United States Patent
Sampayan et al.

(10) Patent No.: US 12,529,970 B2
(45) Date of Patent: *Jan. 20, 2026

(54) PHOTOCONDUCTIVE CHARGE TRAPPING APPARATUS

(71) Applicants: Lawrence Livermore National Security, LLC, Livermore, CA (US); Opcondys, Inc., Manteca, CA (US)

(72) Inventors: Stephen Sampayan, Livermore, CA (US); Paulius Vytautas Grivickas, Pleasanton, CA (US); Kristin Cortella Sampayan, Manteca, CA (US)

(73) Assignees: Lawrence Livermore National Security, LLC, Livermore, CA (US); Opcondys, Inc, Manteca, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/805,645

(22) Filed: Jun. 6, 2022

(65) Prior Publication Data

US 2022/0308471 A1  Sep. 29, 2022

Related U.S. Application Data

(63) Continuation of application No. 16/630,273, filed as application No. PCT/US2017/053066 on Sep. 22, 2017, now Pat. No. 11,366,401.

(51) Int. Cl.
G03G 5/04 (2006.01)
G02B 6/42 (2006.01)
(Continued)

(52) U.S. Cl.
CPC ............. *G03G 5/04* (2013.01); *G02B 6/4295* (2013.01); *H03K 17/78* (2013.01); *H10F 30/10* (2025.01); *H10F 30/21* (2025.01); *H10F 55/255* (2025.01)

(58) Field of Classification Search
CPC ........ G03G 5/04; G02B 6/4295; H01L 31/09; H01L 31/101; H01L 31/173; H03K 17/78
See application file for complete search history.

(56) References Cited

U.S. PATENT DOCUMENTS

| 4,086,459 A | 4/1978 | Rich |
| 5,341,017 A | 8/1994 | Booth et al. |
| (Continued) | | |

FOREIGN PATENT DOCUMENTS

| CN | 101820129 A | 9/2010 |
| CN | 103681969 B | 5/2016 |
| (Continued) | | |

OTHER PUBLICATIONS

J. S. Sullivan and J. R. Stanley, "6H—SiC photoconductive switches triggered at below bandgap wavelengths," in IEEE Transactions on Dielectrics and Electrical Insulation, vol. 14, No. 4, pp. 980-985, Aug. 2007, doi: 10.1 109/TDEI.2007.4286537.*

(Continued)

*Primary Examiner* — Bitew A Dinke
(74) *Attorney, Agent, or Firm* — Perkins Coie LLP

(57) ABSTRACT

Techniques, systems, and devices are disclosed for implementing a photoconductive device performing bulk conduction. In one exemplary aspect, a photoconductive device is disclosed. The device includes a light source configured to emit light; a crystalline material positioned to receive the light from the light source, wherein the crystalline material is doped with a dopant that forms a mid-gap state within a bandgap of the crystalline material to control a recombination time of the crystalline material; a first electrode coupled to the crystalline material to provide a first electrical contact for the crystalline material, and a second electrode coupled to the crystalline material to provide a second electrical contact for the crystalline material, wherein the first and the second electrodes are configured to establish an electric field (Continued)

across the crystalline material, and the crystalline material is configured to exhibit a substantially linear transconductance in response to receiving the light.

21 Claims, 14 Drawing Sheets

(51) Int. Cl.
  *H03K 17/78* (2006.01)
  *H10F 30/10* (2025.01)
  *H10F 30/21* (2025.01)
  *H10F 55/255* (2025.01)

(56) References Cited

U.S. PATENT DOCUMENTS

| | | | |
|---|---|---|---|
| 8,258,632 | B1 | 9/2012 | Sullivan et al. |
| 8,563,930 | B2 | 10/2013 | Harris et al. |
| 9,142,339 | B2 | 9/2015 | Sampayan |
| 9,468,087 | B1 | 10/2016 | Joshi |
| 9,748,859 | B2 | 8/2017 | Sampayan |
| 11,366,401 | B2 * | 6/2022 | Sampayan ............... G03G 5/04 |
| 2007/0092812 | A1 | 4/2007 | Caporaso et al. |
| 2009/0261258 | A1 | 10/2009 | Harris et al. |
| 2010/0276594 | A1 | 11/2010 | Rafailov et al. |
| 2010/0282949 | A1 * | 11/2010 | Caporaso ............... H01L 31/09 250/214 SW |
| 2011/0101376 | A1 * | 5/2011 | Caporaso ............... H05H 7/00 257/77 |
| 2011/0266556 | A1 | 11/2011 | Leonard et al. |
| 2013/0056842 | A1 | 3/2013 | Sullivan et al. |
| 2013/0328058 | A1 | 12/2013 | Nelson |
| 2013/0328146 | A1 | 12/2013 | Nelson |
| 2013/0342306 | A1 * | 12/2013 | Sampayan ............ H01C 7/1013 338/15 |
| 2014/0038321 | A1 * | 2/2014 | Caporaso ............... H01L 31/09 438/57 |
| 2014/0263976 | A1 * | 9/2014 | Sampayan ............. H03C 7/025 250/208.4 |
| 2014/0263979 | A1 * | 9/2014 | Guethlein ........... H01L 31/0312 250/214 SW |
| 2014/0270777 | A1 * | 9/2014 | Sampayan ................ H03F 3/08 398/187 |
| 2014/0284451 | A1 * | 9/2014 | Sampayan ............... H03C 1/34 250/206 |
| 2014/0312741 | A1 * | 10/2014 | Werne .................... H10N 30/40 218/16 |
| 2015/0028674 | A1 * | 1/2015 | Sampayan ............. H02M 7/12 307/43 |
| 2015/0155279 | A1 | 6/2015 | Konrath et al. |
| 2015/0207015 | A1 | 7/2015 | Nunnally |
| 2016/0028222 | A1 | 1/2016 | Johansson |
| 2016/0233370 | A1 | 8/2016 | Jiang et al. |
| 2017/0084365 | A1 | 3/2017 | Nguyen et al. |
| 2018/0013028 | A1 * | 1/2018 | Nelson ................... H03K 17/78 |
| 2018/0084617 | A1 | 3/2018 | Zhang et al. |
| 2018/0190628 | A1 | 7/2018 | Male et al. |
| 2018/0190855 | A1 | 7/2018 | Male |
| 2018/0284565 | A1 * | 10/2018 | Sullivan ................ G02F 1/3501 |
| 2019/0355561 | A1 * | 11/2019 | Sampayan ............. H01J 40/06 |
| 2020/0356016 | A1 | 11/2020 | Sampayan et al. |

FOREIGN PATENT DOCUMENTS

| | | | |
|---|---|---|---|
| EP | 2490263 | A2 | 8/2012 |
| JP | H0745857 | A | 2/1995 |
| JP | 63318193 | | 12/1998 |
| JP | 2009513017 | A | 3/2009 |
| JP | 2011518442 | A | 6/2011 |
| WO | 03050519 | A1 | 6/2003 |
| WO | 2007120191 | A2 | 10/2007 |
| WO | 2009129512 | A2 | 10/2009 |
| WO | WO-2011098029 | A1 * | 8/2011 ..... H01L 31/022408 |
| WO | 2011118934 | A2 | 9/2011 |
| WO | 2016088952 | A1 | 6/2016 |
| WO | 2019059932 | A1 | 3/2019 |

OTHER PUBLICATIONS

Sampayan, Kristin. "16 kV, 75 kHz, 50% Duty Cycle, SiC Photonic Based Bulk Conduction Power Switch Development." Materials Science Forum, vol. 897, Trans Tech Publications, Ltd., May 15, 2017, pp. 583-586. Crossref, doi:10.4028/www.scientific.net/msf.897.583.*

Grivickas, Paulius, et al. "Probing of Carrier Recombination in N- and p-Type 6H—SiC Using Ultrafast Supercontinuum Pulses." Materials Science Forum, vol. 821-823, Trans Tech Publications, Ltd., Jun. 2015, pp. 245-248. Crossref, doi:10.4028/www.scientific.net/msf.821-823.245.*

Callavik, Magnus, et al., "The Hybrid HVDC Breaker," An innovation breakthrough enabling reliable HVDC grids, ABB Grid Systems, Technical Paper, 2012.

Chowdhury, S. et al., "4H—SiC n-channel DMOS IGTBs on (0001) and (000-1) Oriented Lightly Doped Free-standing Substrates." Materials Sciences Forum, vol. 858, pp. 954-957, 2016.

Extended European Search Report mailed Mar. 15, 2021 in European Patent Application No. 17925559.1, 9 pages.

Hettler, C. et al., "Carrier lifetime studies of semi-insulating silicon carbide for photoconductive switch applications," Power Modulator and High Voltage Conference, May 23, 2010, pp. 34-37.

International Search Report and Written Opinion received in the application No. PCT/US2017/053066, mailed on Jun. 21, 2018, 12 pages.

Office Action mailed Mar. 28, 2022 for Japanese Patent Application No. 2020-538521.

Office Action mailed Mar. 31, 2022 for Canadian Patent Application No. 3,076,468.

Ordonez, J.S. et al., "Long-term Adhesion Studies of Polyimide to Inorganic and Metallic Layers." Mater. Res. Soc. Proc., vol. 1466, 2012, 7 pages.

Sampayan, Stephen E., et al., "Recovery Properties of Vacuum Spark Gaps," IEEE Trans Plasma Sci., v.17, No. 6, p. 889 (1989).

Sullivan, J.S., "High power operation of a nitrogen doped vanadium compensated, 6H—SiC extrinsic photodoncudtive switch," Applied Physics Letters, AIP Publishing LLC, vol. 104, No. 17, Apr. 28, 2014.

Tamulaitis, G., et al., "Carrier lifetime in conductive and vanadium-doped 6H—SiC substrates," Applied Physics Letters, vol. 84, No. 3, 2004.

Watanabe, N et al., "6.5 kV n-Channel $h-SiC IGBT with Low Switching Loss Achieved by Extremely Thin Drift Layer." Materials Science Forum, vol. 858, pp. 939-944, 2016.

Ciniglio, O. A., et al., "The Application of Photoconductive Switches in HVDC Circuit Interruption," IEEE Transactions on Power Delivery, vol. 5, No. 1, pp. 460-466, 1990.

Triaros, Christos P., et al., "Photoconductive Switches for AC Circuit Protection," IEEE Transactions on Electron Devices, vol. 37, No. 12, pp. 2526-2531, 1990.

Hayes, J. et al, "Bidirectional, SiC module-based solid-state circuit breakers for 270 Vdc MEA/AEA systems," 2016 IEEE 4th Workshop on Wide Bandgap Power Devices and Applications (WiPDA), 2016, pp. 70-77.

Nunnally, William C., "High-Power Microwave Generation Using Optically Activated Semiconductor Switches," IEEE Transactions on Electron Devices vol. 37, No. 12, p. 2439-2448, 1990.

O. A. Ciniglio, D. P. Carroll and H. Mehta, "The application of photoconductive switches in HVDC circuit interruption," in IEEE Transactions on Power Delivery, vol. 5, No. 1, pp. 460-466, Jan. 1990, doi: 10.1109/61.107313.

Sampayan, K., et al., "Wide Bandgap Photoconductive Switches Driven by Laser Diodes as a High-Voltage Mosfet Replacement for Bioelectrics and Accelerator Applications," 2019 IEEE Pulsed Power & Plasma Science (PPPS), 2019, pp. 1-4.

(56) References Cited

OTHER PUBLICATIONS

Sampayan et al. "A 20 KV, 125 kHz Photonically Driven Power MOSFET-like Device," 2019 IEEE Energy Conversion Congress and Exposition (ECCE), Baltimore, MD, USA, 2019, pp. 4546-4550.

Majda-Zdancewicz, et al., "Current state of photoconductive semiconductor switch engineering", Opto-Electronics Review, vol. 26, Issue 2, 2008, pp. 92-102, ISSN 1230-3402, https://doi.org/10.1016.j.opelre.2008.02.003.

Sampayan, Kristin, et al., "A 20 kV, 125 KHz Photonically Driven Power MOSFET-like Device", IEEE Energy Conversion Congress and Exposition (ECCE), Baltimore, MD, USA, 2019, pp. 4546-4550, doi: 10.1109/ECCE.2019.8912299.

\* cited by examiner

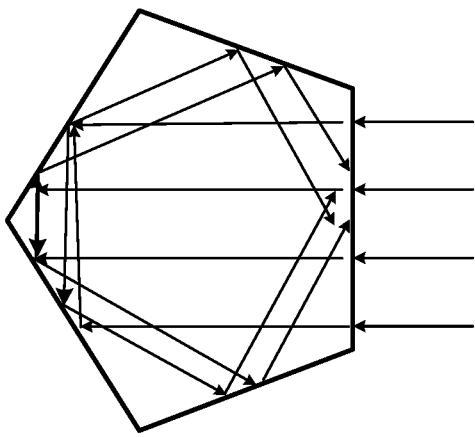
FIG. 9C
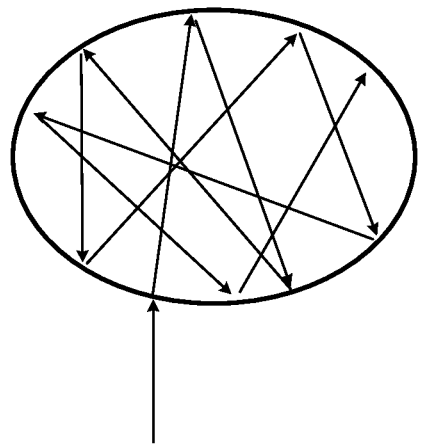
FIG. 9E
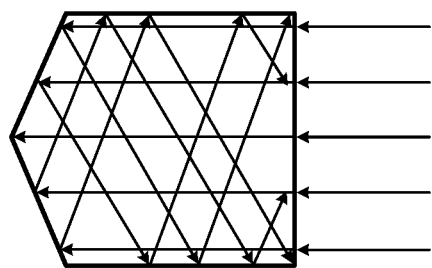
FIG. 9B
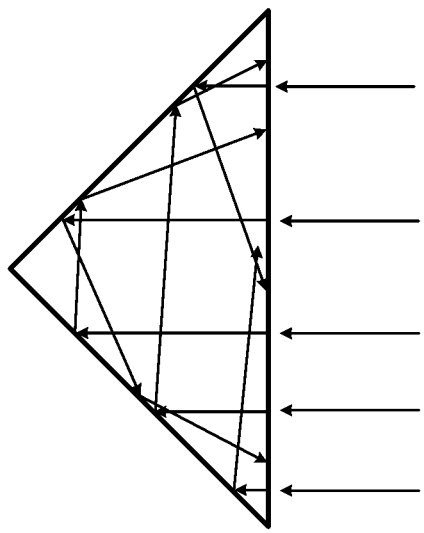
FIG. 9A
FIG. 9D

PHOTOCONDUCTIVE CHARGE TRAPPING APPARATUS

CROSS REFERENCE TO RELATED APPLICATIONS

This patent document is a continuation of and claims the benefit of priority to U.S. patent application Ser. No. 16/630,273, filed on Jan. 10, 2020, now U.S. Pat. No. 11,366,401, which is a 371 National Phase Application of International Patent Application No. PCT/US2017/053066, filed on Sep. 22, 2017. The entire contents of the above noted applications are incorporated by references as part of the disclosure of this document.

FEDERALLY SPONSORED RESEARCH OR DEVELOPMENT

This invention was made with Government support under Contract No. DE-AC52-07NA27344 awarded by the United States Department of Energy. The Government has certain rights in the invention.

TECHNICAL FIELD

The subject matter of this patent document relates to circuits and devices, including circuits and devices having photoconductive material.

BACKGROUND

Most electronic circuits and devices are constructed by using only electronic circuit elements such as conductors, resistors, capacitors, inductors and transistors. Such electronic circuits and devices based on all electronic components, however, may be limited in performance and operations for certain applications. For example, in some applications it is desirable to have fast and high-voltage solid state control devices for efficient power switching, protection, and conversion.

SUMMARY OF PARTICULAR EMBODIMENTS

Techniques, systems, and devices are disclosed for implementing a photoconductive device performing bulk conduction.

In one exemplary aspect, a photoconductive device is disclosed. The photoconductive device includes a light source configured to emit light; a crystalline material positioned to receive the light from the light source, wherein the crystalline material is doped with a dopant that forms a mid-gap state within a bandgap of the crystalline material to control a recombination time of the crystalline material; a first electrode coupled to the crystalline material to provide a first electrical contact for the crystalline material, and a second electrode coupled to the crystalline material to provide a second electrical contact for the crystalline material, wherein the first and the second electrodes are configured to establish an electric field across the crystalline material, and wherein the crystalline material is configured to exhibit a substantially linear transconductance in response to receiving the light from the light source.

In some embodiments, the device further includes a reflective coating on the crystalline material to allow the light to reflect within the crystalline material. In some embodiments, the crystalline material includes an input aperture to allow the light to enter the crystalline material from a first end, and a facet on an opposite end of the input aperture that is oblique with respect to a path of the light that enters the crystalline material.

In some embodiments, a wavelength of the light that enters the crystalline material is longer than a wavelength corresponding to a bandgap of the crystalline material. In some implementations, the crystalline material has a curved surface.

In some embodiments, the crystalline material includes silicon carbide. In some implementations, the dopant includes one of: Vanadium, nitrogen, aluminum, or boron.

In some embodiments, the device further includes an optical waveguide positioned in a path of the light between the light source and the crystalline material to direct the light from the light source to the crystalline material. In some implementations, the first electrode is formed as a base plate that includes one of a metal, a metal alloy, or a metal matrix.

In some embodiments, the device further includes a substrate positioned between the crystalline material and the first electrode to spread heat generated by the crystalline material when excited by the light. In some implementations, the substrate includes one of a metalized diamond, a direct bonded copper over aluminum oxide, an aluminum nitride, a silver-chemical vapor deposition diamond (CVD), an aluminum-CVD, or a copper-CVD. In some embodiments, the device further includes a bond material positioned between the substrate and the crystalline material, or between the substrate and the first electrode, to reduce gradients of coefficients of thermal expansion between the substrate and the crystalline material, or between the substrate and the base plate. In some implementations, the bond material includes 96.5% tin, 3% silver, and 0.5% copper.

In some embodiments, the device further includes an insulating coating around the crystalline material. In some implementations, the insulating coating includes a multilayer polyimide film.

In some embodiments, the crystalline material is doped to produce a recombination time that is at least one order of magnitude smaller than a characteristic time of a highest frequency component of an electrical signal controlling the light source. In some embodiments, the crystalline material is doped to include a particular amount of carriers to achieve a predetermined value for the recombination time when excited by the light having a particular wavelength or range of wavelengths. In some embodiments, the crystalline material is formed as part of a structure that receives the light from the light source, and wherein the structure is shaped to cause the light that propagates through the crystalline material to undergo multiple internal reflections.

In another exemplary aspect, a charge-trapping apparatus is disclosed. A crystalline material doped with a dopant, wherein the dopant forms a mid-gap state within a bandgap of the crystalline material to achieve a recombination time of a predetermined value upon excitation of the crystalline material by light of a particular wavelength or range of wavelengths; and a pair of electrodes coupled to the crystalline material and configured to allow an electric field to be established across the crystalline material.

In some embodiments, the crystalline material includes silicon carbide. In some implementations, the dopant includes one of: Vanadium, nitrogen, aluminum, or boron.

In some implementations, the crystalline material has a curved surface. In some embodiments, the crystalline material includes an input aperture to allow a beam of light to enter the crystalline material from a first end, and a facet on an opposite end of the input aperture that is oblique with respect to a path of the beam of light that enters the crystalline material. In some embodiments, the apparatus further includes a reflective coating on the crystalline material to allow the beam of light to reflect within the crystalline material. In some implementations, the crystalline material is configured to exhibit a substantially linear transconductance in response to receiving the beam of light.

In some embodiments, wherein the crystalline material is doped to produce a recombination time that is at least one order of magnitude smaller than a characteristic time of a highest frequency component of an electrical signal controlling the light source. In some implementations, the crystalline material is doped to include a particular amount of carriers to achieve the predetermined value for the recombination time. In some embodiments, the crystalline material is formed as part of a structure that receives a beam of light from a light source, and wherein the structure is shaped to cause the light that propagates through the crystalline material to undergo multiple internal reflections.

The above and other features and their embodiments or implementations are described in greater detail in the drawings, the description and the claims.

BRIEF DESCRIPTION OF THE DRAWINGS

FIGS. 9A-9E show schematic diagrams of exemplary configurations to maximize total internal reflection of the incoming light.

DETAILED DESCRIPTION

In this patent document, the word "exemplary" is used to mean serving as an example, instance, or illustration. Any embodiment or configuration described herein as "exemplary" is not necessarily to be construed as preferred or advantageous over other embodiments or configurations. Rather, use of the word exemplary is intended to present concepts in a concrete manner.

The state-of-the-art silicon carbide (SiC) control junction devices typically require thick drift regions to achieve adequate high voltage hold-off. Factors such as limited carrier drift speed (e.g., $<10^7$-cm-s$^{-1}$), slow transition times (e.g., around 0.5-µs) and/or limited switching rates (e.g., around 10-kHz) can adversely impact grid efficiency through wasted energy from increased transition loss and hysteresis loss in external magnetic components.

Figure 1A:
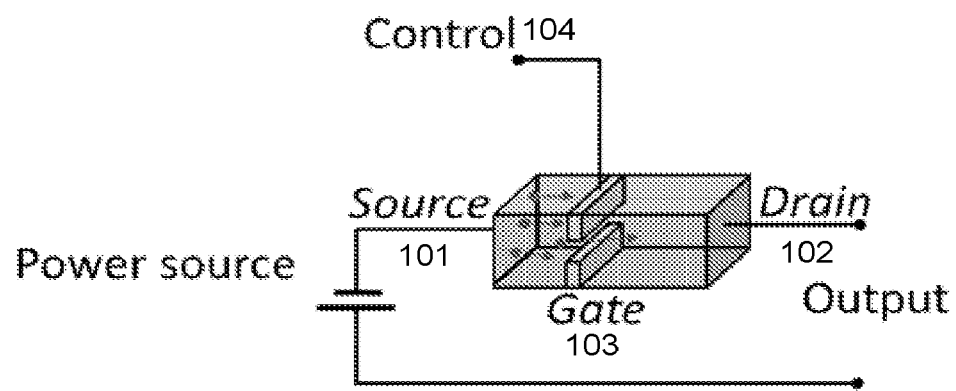
FIG. 1A shows a schematic diagram of an exemplary junction transistor.

FIG. 1A shows a schematic diagram of an exemplary junction transistor. When a voltage is applied between two opposing terminals (e.g., a source 101 and a drain 102), a third intervening terminal (e.g., a gate 103) can be used to control the current, I, through the device. The action at the control electrode 104 is delayed at the drain 102 by the carrier transit time. This delay is proportional to x/µE, where x is the drift length, µ is the carrier mobility, and E is the applied electric field. Because the applied field is limited by intrinsic material properties, such devices are inherently slow for handling high voltages.

Power semiconductor devices such as bipolar junction and field effect transistors also exploit a transconductance property. The behavior of the current, I, is related to a quantity defined as the transconductance. It takes the general form: $g_m = \Delta I_{out}/\Delta \xi_{in}$ where $\xi_{in}$ is the controlling input. In field effect devices, $\xi_{in}$ is the voltage applied to the gate. Amplification is then $V_{out} = V_g g_m Z_o$, where $V_g$ is the input voltage and $Z_o$ is the load impedance. These simple relationships serve as the basic foundation for electronic circuitry. Transconductance has been observed in junction devices fabricated from Ge, Si, ZnO, Graphene, carbon nanotubes, InAs nanowire channels, GaN/InAlN, organic semiconductors, and gel-solution gated structures.

Figure 1B:
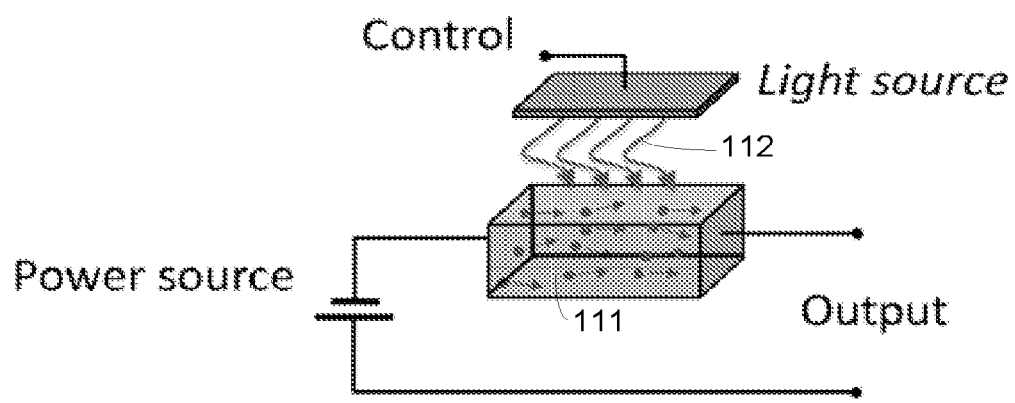
FIG. 1B shows a schematic diagram of an exemplary photoconductive device.

FIG. 1B shows a schematic diagram of an exemplary photoconductive device. A photoconductive device is an electrical device that operates based on the optical conductivity of a material 111, i.e., an increase in the electrical conductance as a consequence of irradiation with light 112. One important aspect of the photoconductive device that makes it more capable to handle high voltages than junction devices is bulk conduction. Bulk conduction is the process where the close to the entirety of the device is turned on simultaneously. One exemplary approach in photoconductive devices is to eliminate the carrier transit delay by simultaneously generating charge carriers in the bulk of the device with light or other types of radiation.

Transconductance has also been observed in photoconductive devices. For example, indirect photoconductive control of the device current has been integrated into these types of devices for power systems. Direct control of carriers by photons, on the other hand, has distinct advantages. For instance, if the illumination is transverse to the current, bulk control is fundamentally limited only by speed of light transit time. Transition losses are therefore significantly lower as compared to a standard junction device. However, currently linear photoconductive control requires an intervening control junction between the through terminals of the device.

This patent document describes a bulk conduction approach that allows a photoconductive device to exhibit a linear transconductance like-property, limited only by the recombination time of the photoconductive material. In some embodiments, the linear transconductance-like property is achieved using a doped crystalline material combined with a below-bandgap optical excitation. In some embodiments, an optical drive excites carriers directly throughout the bulk of the crystalline material while the dopant provides non-radiative recombination (NRR) centers.

Details regarding the optical-conductive device are further discussed in the following sections.

Material Properties

Materials used in photoconductive devices, if designed properly, have the ability to mimic the transconductance property of standard junction transistors. As discussed above, transconductance, $g_m$, is a property relating the output of a device to a controlling input. For a semiconductor junction, this property is a direct outcome of the behavior of the charge carriers under the influence of an externally applied electric field resulting from the physical dynamics at the junction.

Past photoconductive devices have focused on short pulse (<100-ns) megawatt peak power levels, latch-on bi-modal on-off switching, or required the use of dual optical energies to initiate and then quench carriers. Past wide bandgap (WBG) photoconductive studies have focused on eliminating these recombination centers for increased efficiency. This patent document, on the other hand, discusses techniques to control and exploit the NRR density to trade fidelity and speed against forward power gain.

One way in which a photoconductive device differs from a junction device is that the transconductance property in a photoconductive device is only an approximation. Although the charge carriers similarly respond to an equivalent $\xi_{in}'$ as the controlling input, the carriers decay based on the physical dynamics and can be intentionally designed into the material crystal lattice. For most materials, the conductance is very low (e.g., high resistance around $10^8$ ohm) in the quiescent state. In correctly designed materials, however, optical pumping can excite charge carriers into the conduction band, rendering the material conductive. Controlled carrier decay then results from the physical recombination or "trapping" based on the designed material crystal lattice of the material.

The transconductance of a photoconductive material can be obtained as follows. First, a general expression for the behavior of the charge carrier density, which is proportional to the conductance, g(t), can be described using the continuity equation:

$$\frac{dg(t)}{dt} + \frac{g(t)}{\tau} = \frac{g_o}{\tau} S(t) \qquad \text{Eq. (1)}$$

Here, $\tau$ is the recombination time, $g_o$ is the maximum conductivity, and S(t) is the normalized optical intensity. Eq. (1) describes the excitation of charge carriers by function S(t) and the subsequent trapping with a time constant $\tau$.

The general solution to Eq. (1) from t=0 is:

$$g(t) \propto e^{-\frac{t}{\tau}} \int_0^t S(t') e^{\frac{t'}{\tau}} dt' \qquad \text{Eq. (2)}$$

Therefore, the carriers within a photoconductive material under an optical pump can be described by the above integral equation. As an example, with a prompt excitation impulse "spike," $\delta(t)$, the integral for g(t) is an exponential decay. But for slowly varying S(t) compared to $\tau$, the integral for g(t) reduces to being proportional to S(t). Therefore, $\xi_{in}'$ is the controlling input that is inversely proportional to $$\frac{1}{S(t)} : \xi_{in}' \rightarrow \frac{1}{S(t)}.$$

In other words, the photoconductive material exhibits a linear transconductance-like property with an optical excitation when the recombination time, T, is small (e.g., around or below 1 ns) compared to the characteristic time of the highest frequency components of the electrical signal controlling the light source (e.g., around 10 ns in power electronics). The error in reproducing a g(t) for a given $\xi_{in}'$ and recombination time, $\tau$, can be determined by performing the actual integral and comparing $\xi_{in}'$ and g(t).

Figure 2:
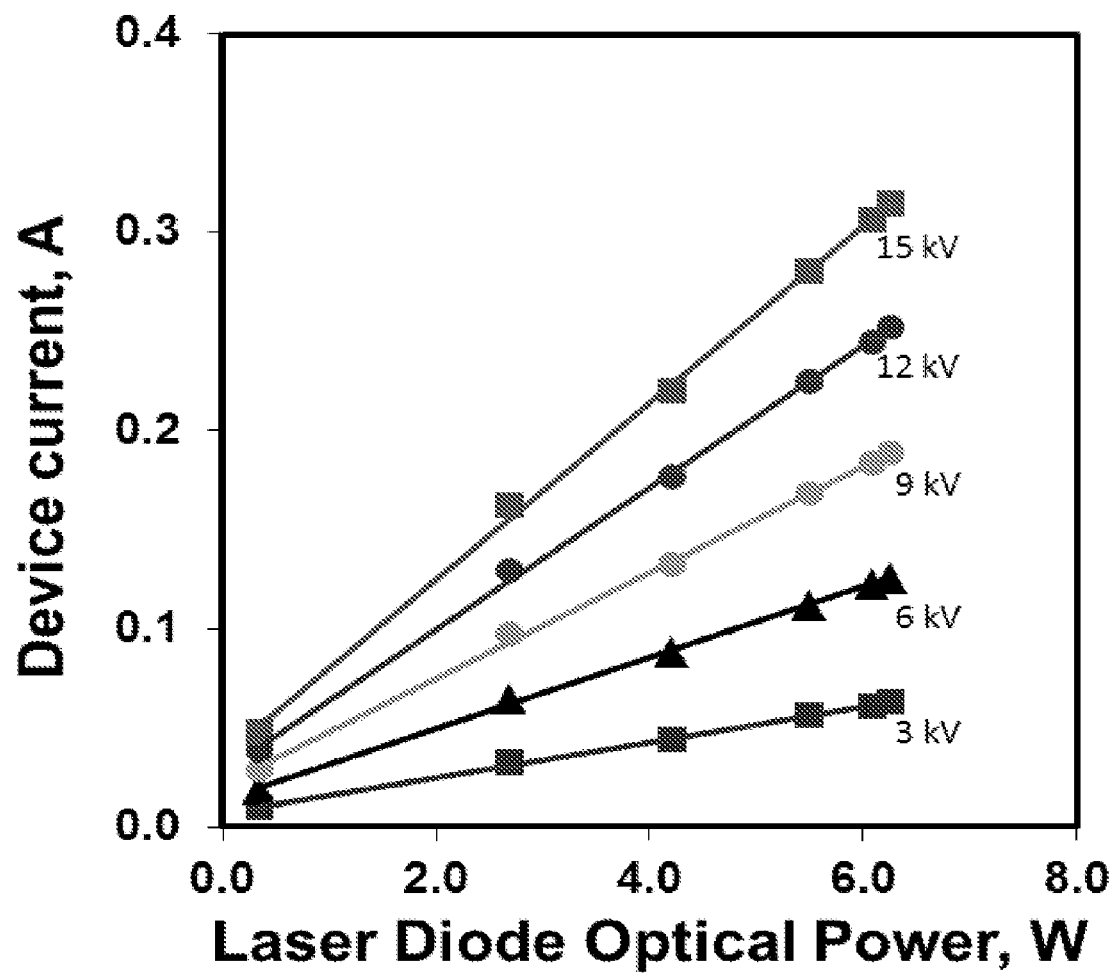
FIG. 2 shows an exemplary plot demonstrating the transconductance property and linearity.

FIG. 2 shows an exemplary plot demonstrating the transconductance property and linearity. The recombination time, $\tau$, for this particular set of data was approximately 1 ns and the equivalent time of the applied signal exceeded 10 ns. Varying the light intensity $\xi_{in}'$ as on the x-axis leads to the current variation on the y-axis for a given voltage across the device. Materials and material regions that exhibit a linear correspondence between an intensity of an input signal and the resulting current are referred to as a charge trapping volume responsive to radiation.

Doping Mechanism

The above approximation makes an assumption of a simple exponential decay of the carriers. In many materials, however, the decay is more complex. Doping the material using dopants, such as Vanadium, is one way to affect the recombination time of the material.

In some embodiments, a crystalline material, such as 4H—SiC or 6H—SiC, is prepared by controlled doping with deep-level impurities (e.g., Vanadium). The bulk crystalline material can be grown using a modified Lely process, which introduces one or more selected dopants (e.g., Vanadium). For example, 6H—SiC single crystals can be grown by the physical vapor transport (PVT) method by first depositing Si and carbon vapor species on a SiC seed crystal. The vapor is supplied by the sublimation of a high purity SiC source. Dopants can be added in the PVT process to achieve controlled doping of the 6H—SiC. Contrary to previous Lely-like processes, which aim to minimize unintended dopants in the growth, this process can introduce various dopants (e.g., Vanadium, nitrogen, aluminum, boron, etc.) in a controlled way to increase the amount of carriers present in the final crystalline material.

Figure 3:
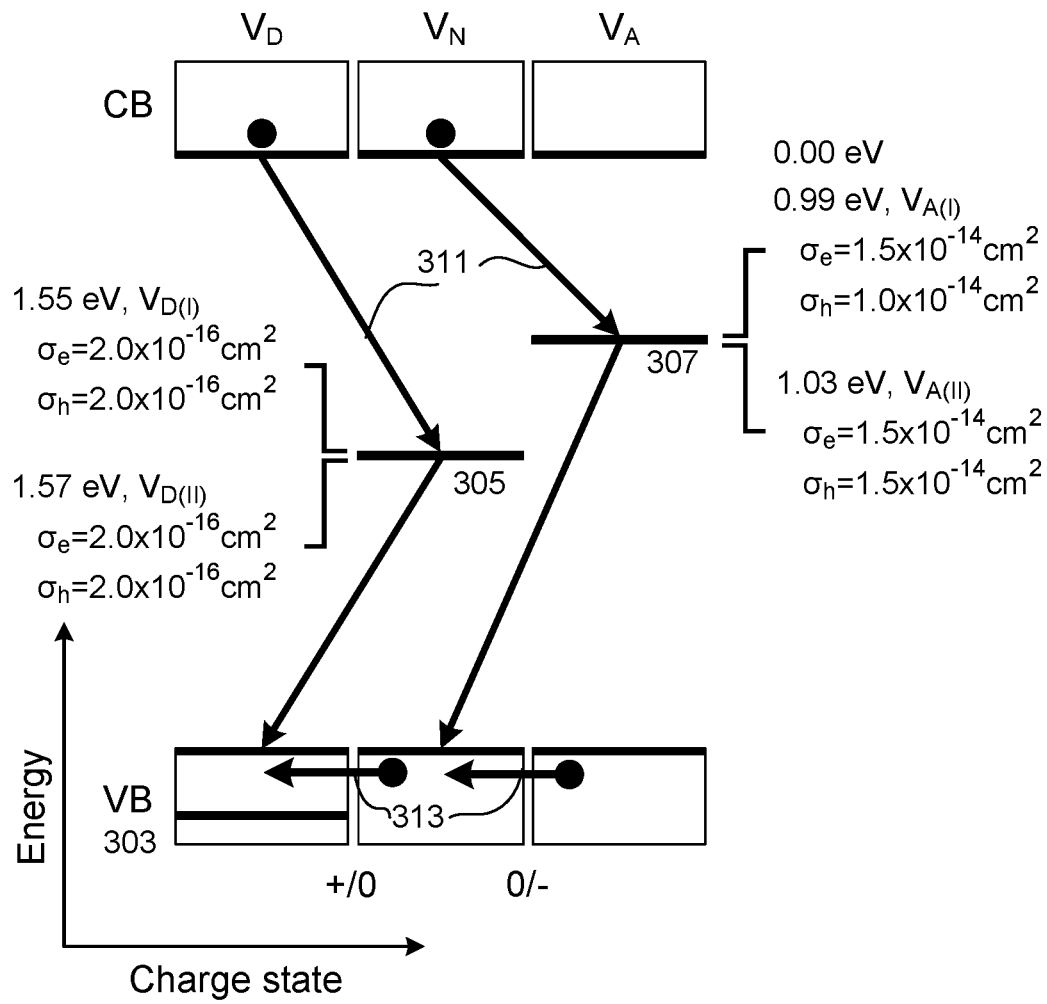
FIG. 3 shows a schematic diagram demonstrating an exemplary bandgap structure in 4H Vanadium doped silicon carbide.

The dopant, such as Vanadium, at the substitutional Si sites forms deep mid-gap levels in SiC with transformation into an amphoteric behavior (i.e., exhibit acceptor and donor states depending on the Fermi level). During growth, Vanadium compensates unintentional shallow impurities producing Semi Insulating (SI) material. FIG. 3 shows a schematic diagram demonstrating an exemplary bandgap structure in 4H Vanadium doped silicon carbide. FIG. 3 depicts the conduction band (CB) 301 and valance band (VB) 303. Two mid-gap states (i.e., Vanadium sites) within the band gap 305 and 307 have been observed. During excitation, Vanadium sites 305 and 307 become effective recombination centers. By imposing the conditions of energy and charge conservation, the allowable transitions for electrons as charge carriers (311) and holes as charge carriers (313) are shown. It can be reasonably concluded, based on this diagram, that excited carriers that are pumped into the conduction band to make the material conductive eventually decay according to the measured cross sections of the mid-states in the band gap created by the dopant (e.g., Vanadium). As these mid-states fill, the only other decay path is to continue down into the valance band so that, in effect, mid band cross sections appear to diminish in magnitude so that more time is required for the charge trapping process.

Figure 4:
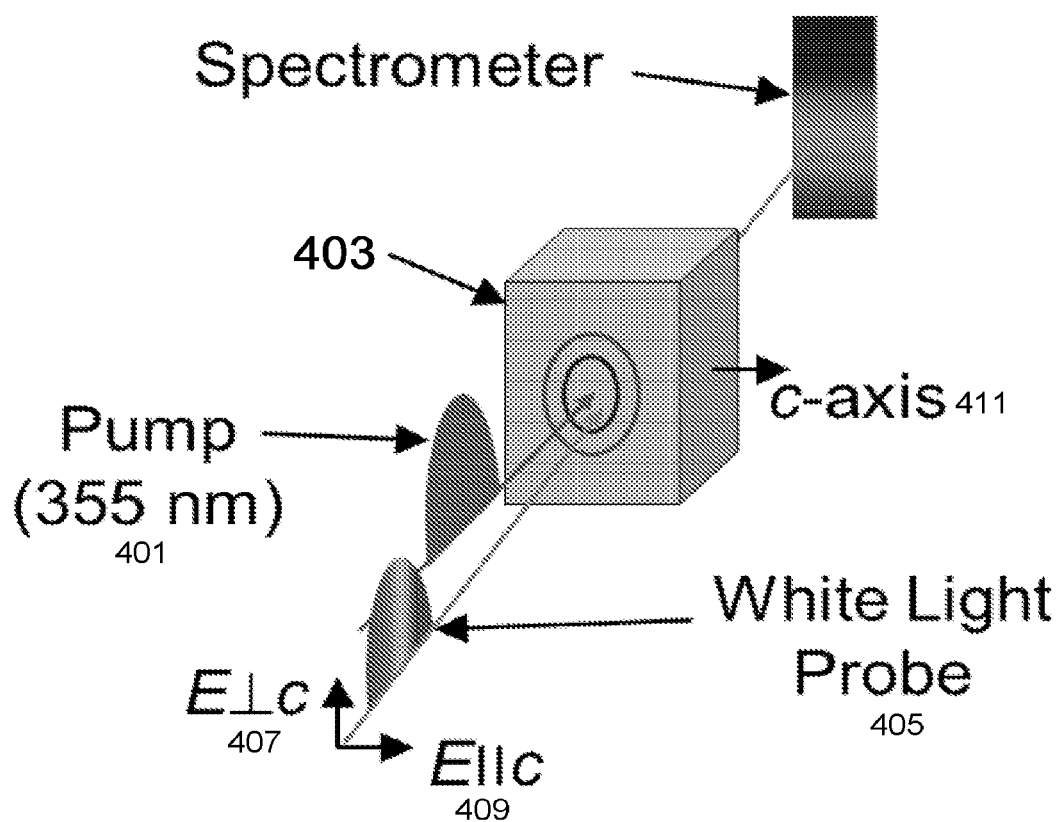
FIG. 4 shows an exemplary setup for measurements demonstrating the effect of doping on the recombination time.

Highly specialized measurements have been made to demonstrate the effect of doping on the recombination time. FIG. 4 shows an exemplary setup for such measurements. In this setup, a very short laser pump pulse of <100 fs at 355 nm (401) was used to excite the material (403). Then, at varying times, a white light probe pulse (405) was used to determine the active carrier density. Data was taken with the light polarization at two orientations, normal (407) and parallel (409), relative to the principal or "c-axis" (411).

Table 1 shows s an exemplary set of epitaxial SI 4H—SiC samples developed for the measurements.

TABLE 1

An exemplary set of epitaxial SI 4H-SiC samples

| | Concentration ($10^{15}$ cm$^{-3}$) | |
| --- | --- | --- |
| Sample | Vanadium | Residual Dopants (n-p) type |
| Epi-0 | — | — |
| Epi-1 | 1.8 | 0.9 |
| Epi-2 | 7.0 | 1.4 |
| Epi-3 | 11.0 | 0.9 |
| Lely-1 | 40.0 | 19.5 |
| Lely-2 | 190.0 | 17.9 |

Figure 5A:
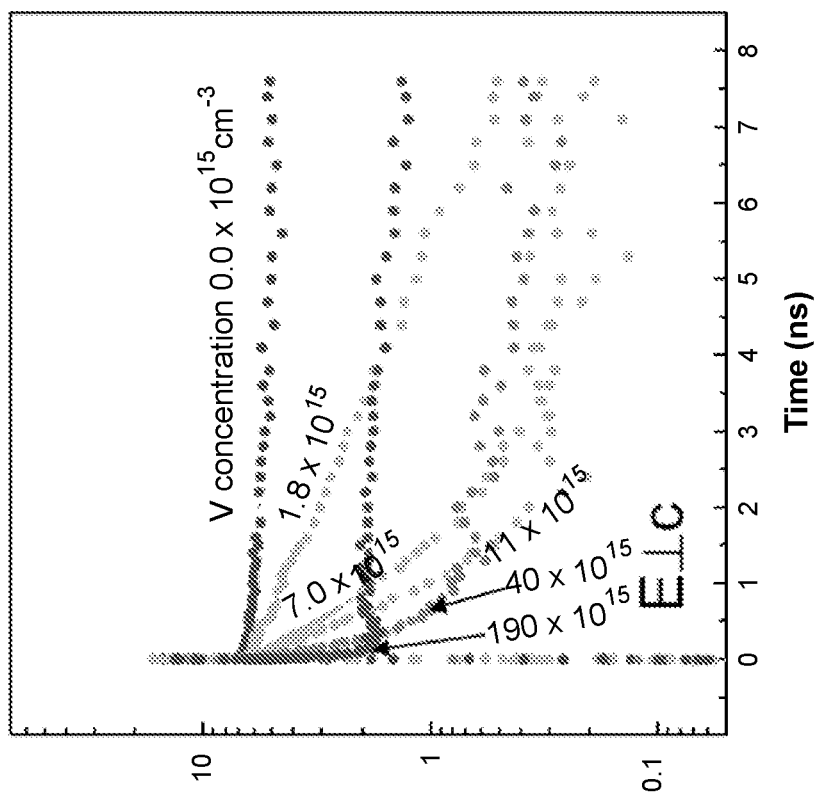
FIG. 5A shows exemplary data collected from the measurements for polarization parallel to the c-axis.
Figure 5B:
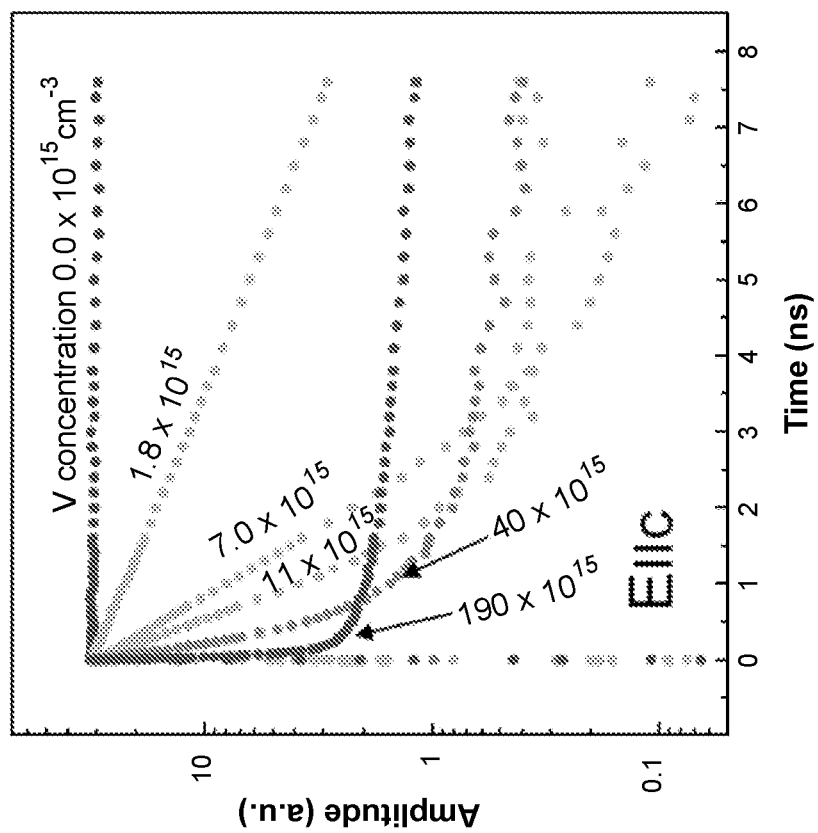
FIG. 5B shows exemplary data collected from the measurements for polarization perpendicular to the c-axis.

FIGS. 5A-B show exemplary data collected from the measurements. The carrier density decreases after the 100 fs pulse is over. Also, increasing the Vanadium concentration decreases the recombination time during the initial portions of the decay curve. As the concentration continues to be increased, a late time plateau begins to develop. This effect is less pronounced for polarization parallel to the c-axis (E∥c) and more pronounced for polarization perpendicular to the c-axis (E⊥c), wherein E is the electric field of the incident light.

For E parallel to c (E∥c) polarization and a Vanadium concentration of about $7 \times 10^{15}$ cm$^{-3}$, the carrier decay is substantially linear for over two orders of magnitude on a semi-log plot. This deep decay indicates that a single time constant dominates the carrier recombination process. Realizing deep carrier decay without a plateau is highly desirable because of the aforementioned conditions on the integral that enables an approximation of a transconductance like property in this device.

Because the plots in FIGS. 5A-B are normalized, what is not evident is the effect of increased Vanadium concentration. That is, the net conductivity of the photoconductive material for a constant light intensity is not shown as a function of the Vanadium concentration. However, because increased Vanadium concentration provides more sites for charge carriers to occupy and therefore be released in the conduction band during excitation, the net on resistance of the photoconductive material is decreased with the increased concentration. Thus, there is a trade-off between the photoconductive material on resistance and the depth of the carrier decay.

Figure 5C:
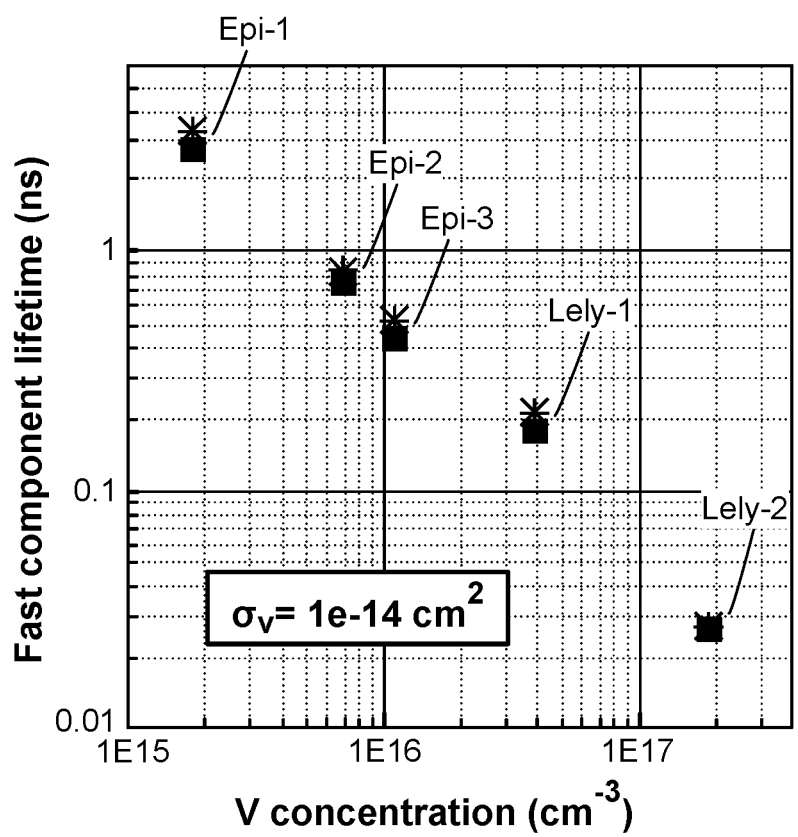
FIG. 5C shows exemplary recombination time as a function of Vanadium concentration.

FIG. 5C shows exemplary recombination time as a function of Vanadium concentration. For Shockley-Read-Hall (SRH), the recombination time is inversely proportional to the cross section $\tau_{TR} \propto 1/\sigma_{TR} N_{TR}$ where $\sigma_{TR}$ and $N_{TR}$ are the trap cross section and concentration, respectively. A Global and Target Analysis (GTA) fit shows agreement with the measured recombination times and the spectroscopy cross section result for the Vanadium acceptor for the electrons. These two observations lead to the conclusion that indeed the fast recombination channel is consistent with the classic SRH model.

Figure 6:
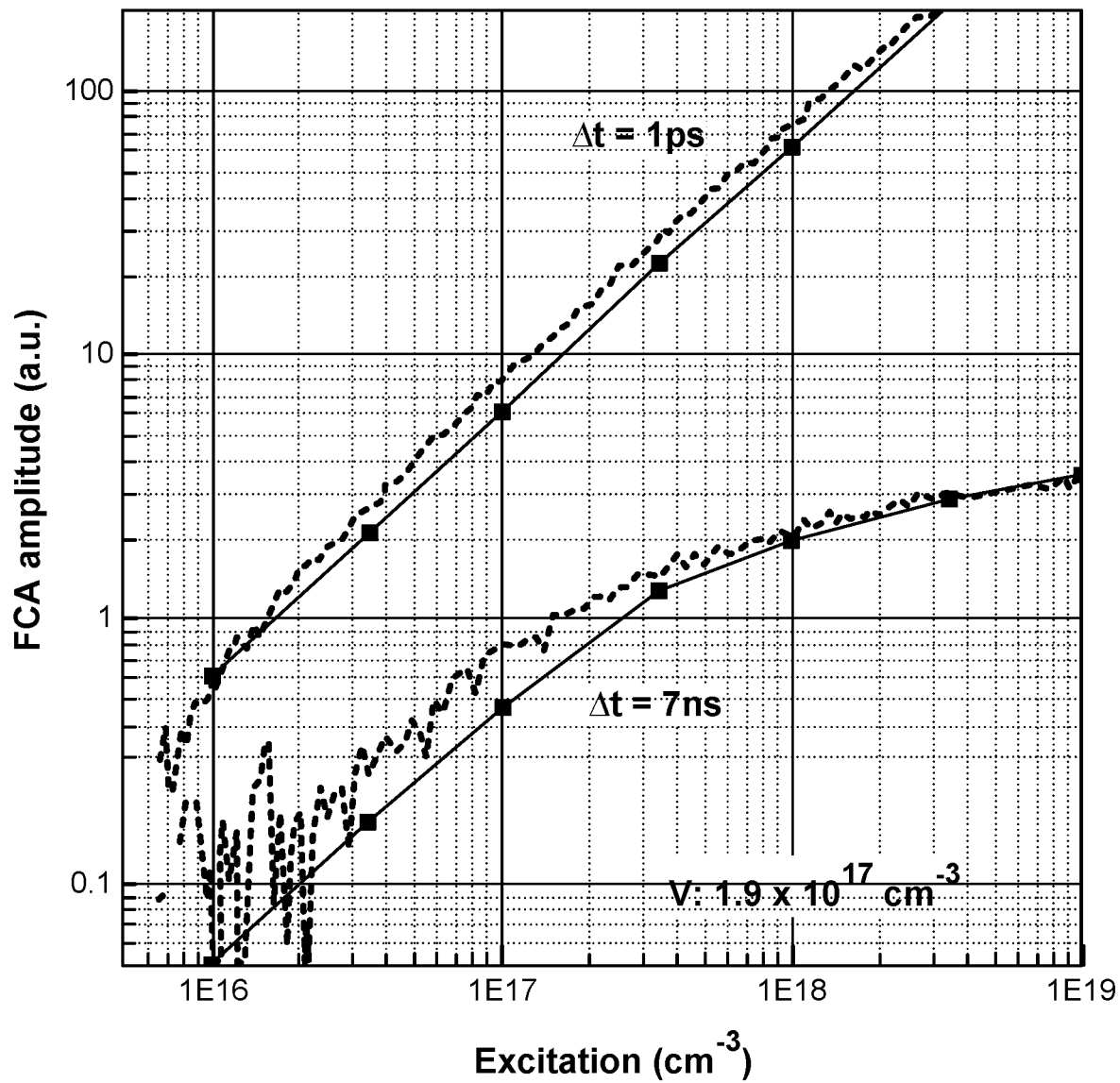
FIG. 6 shows an exemplary plot of measurements of the free carrier absorption as a function of injected carriers at one particular doping concentration.

Additionally, it has been observed that free carriers after excitation demonstrate a saturation process at these mid-bandgap sites for various carrier injection densities. FIG. 6 shows an exemplary plot of measurements of the free carrier absorption as a function of injected carriers at one particular doping concentration ($1.9 \times 10^{17}$ cm$^{-3}$). At very early time (Δt=1 ps), the free carriers in the material show a straightforward functional dependence on the injected carriers. At later times (Δt=7 ns), however, the sites appear to be saturating at approximately the same injected density of the Vanadium dopant. This result indicates that the prompt decay is directly to the mid bandgap sites. Once saturated, the only allowable path from the conduction band is to the valance band. This decay would be characteristically longer and create the plateau observed in FIGS. 5A-B.

Figure 7:
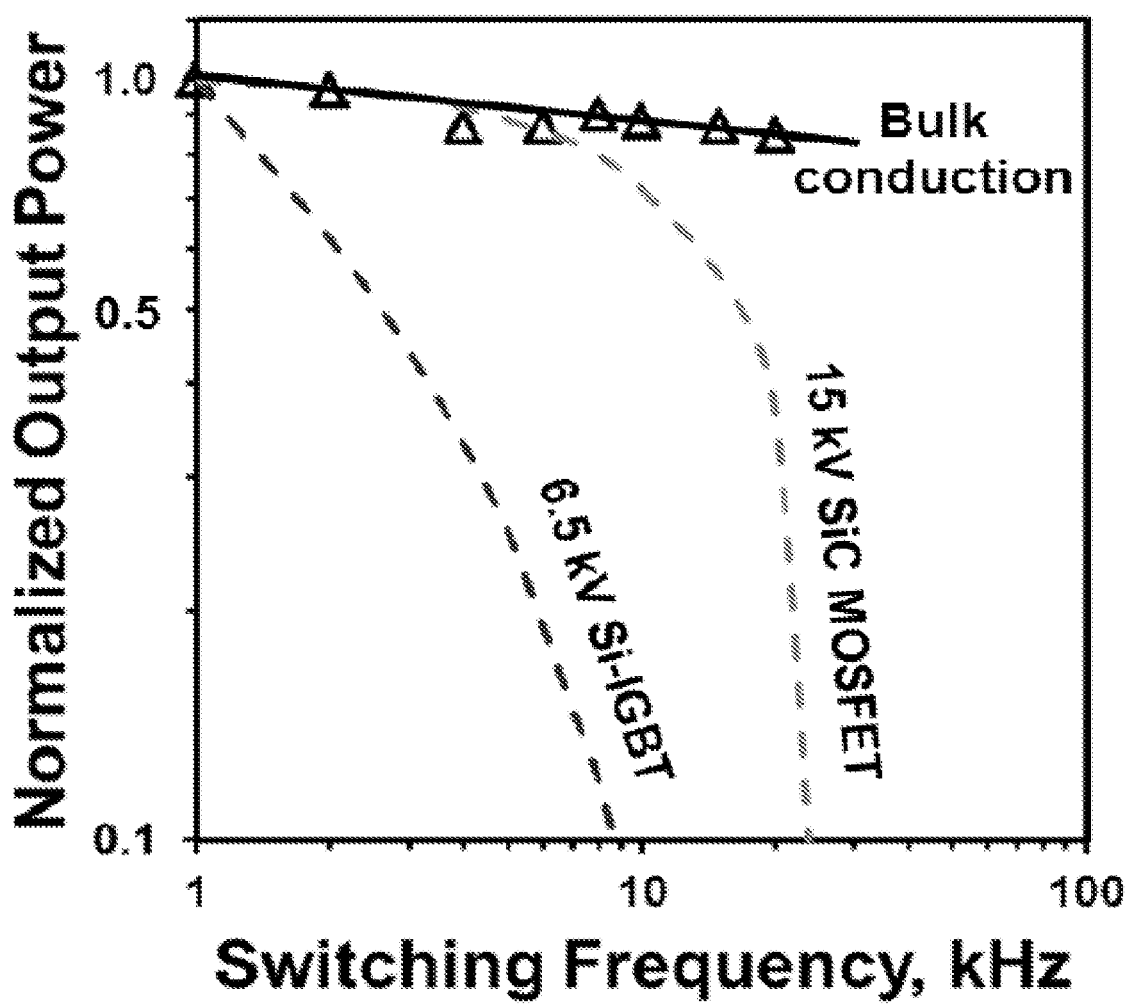
FIG. 7 shows an exemplary comparison between a photoconductive device in accordance with the present technology against two other junction devices.

FIG. 7 shows an exemplary comparison between a photoconductive device in accordance with the present technology against two other junction devices. This comparison shows how the photoconductive device performing bulk conduction (701) is significantly faster than an equivalent voltage SiC MOSFET (703) and much faster than a lower voltage Si IGBT (705). FIG. 7 also shows that the frequency response of the bulk conduction device 701 is dominated by the laser diode driver electronics. In classic junction devices, because of the thickness necessary to withstand the applied high voltage, a thick substrate is required. The current control mechanism utilizes a junction and then a drift of the carriers to the collection electrode; thus transit time determines the device speed. As a results, the thick substrate can be eliminated by excitation with below-bandgap light which controls the population of carriers in the conduction band in the bulk of the device and therefore the current flow. Because carriers are simultaneously excited, drift speed through the substrate does not play a role in the conduction properties. Thus, a much higher switching rate and therefore switching efficiency can be realized. Increased current demonstrated here can be realized with higher laser intensity so that, with the advent of inexpensive laser diode sources, cost competitive bulk condition switches can replace classical junction devices in high voltage power electronics.

It is noted that while the measurements have been done based on a Vanadium dopant, different dopants (nitrogen, aluminum, boron, etc.), as discussed above, may be added to the growth of the crystalline materials to increase the number of carriers present in the crystalline material.

Lighting Control of Bulk Conduction

Furthermore, to accomplish the goal of bulk conduction, it is desirable to have the applied light illuminate the majority of the material volume as efficiently and uniformly as possible so that the current density is relatively constant.

Constant current density ensures minimized local stress and heating. At least three aspects can be taken into consideration. First is to design the structure so that multiple light bounces occur. The multiple bounces randomize the individual rays. Second, a sufficiently long absorption length (i.e., the distance required for the light to decrease intensity to $e^{-1}$, where e is the base of the natural logarithm) is required so that multiple bounces can occur. Because absorption is a function of wavelength of the light, correct selection of the spectral content of the light source is necessary. Third is to ensure that there is a minimum amount of light leakage from the device once the light has been admitted. Absent any specialized optics, the ratio of the area of reflecting surfaces to the admitting surface can be as large as possible.

Figure 8:
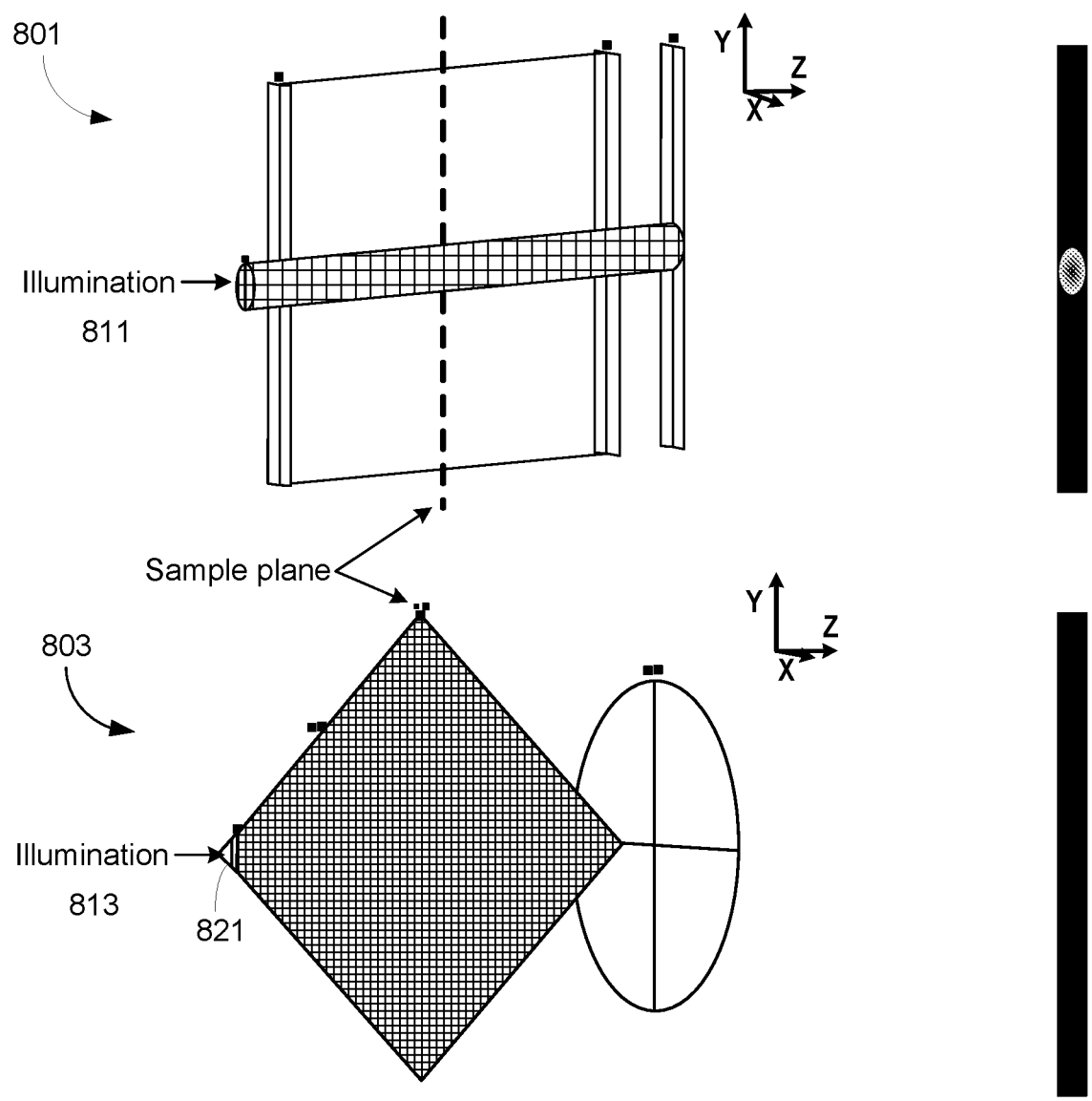
FIG. 8 shows an schematic diagram of exemplary illumination schemes.

FIG. 8 shows a schematic diagram of exemplary illumination schemes. In the top section (801) of FIG. 8, the light 811 originates from a relatively small, low divergence source such as a single laser. Only the narrow illuminated section becomes conductive (beam image at sample plane is shown at far right). By comparison, in the lower section (803), a very small facet 821 is formed at a corner to accept a pin-point light source 813. The remaining surfaces have a fully reflective coating (e.g., a dielectric coating where the electric field is parallel to the facet and a conductive coating on the current collecting surfaces). Total internal reflection occurs except at the point where the light is admitted. Using this particular approach, a resistance of about ten times less can be achieved for a similar light source intensity.

The aperture(s) on the material that admits the light from the light source must be transparent so that the incoming light can come in at a specific entry angle and polarization. At the same time, it is desirable to minimize the amount of exiting light. One method to minimize the amount of exiting light from the aperture(s) is to require that multiple reflections and sufficient absorption have occurred prior to reaching the aperture. To accomplish this goal, the facet on the opposite face of the material may not be normal to the light entry angle. This way, the entering light can undergo sufficient internal reflections and an extended path length to ensure absorption prior to exit.

FIG. 9 shows schematic diagrams of exemplary configurations to maximize total internal reflection of the incoming light. Often times a light source that is thin, yet broad is needed to keep the intensity at the facet within reasonable levels. Configurations (a)-(d) are suitable for this purpose. Yet still another configuration usable for a pencil type beam is shown in configuration (e). It is understood from these diagrams that the light can enter at an angle slightly off parallel from the broad faces so that bounces can occur off the electrodes and thus evenly randomize the light along the device axis.

Figure 10:
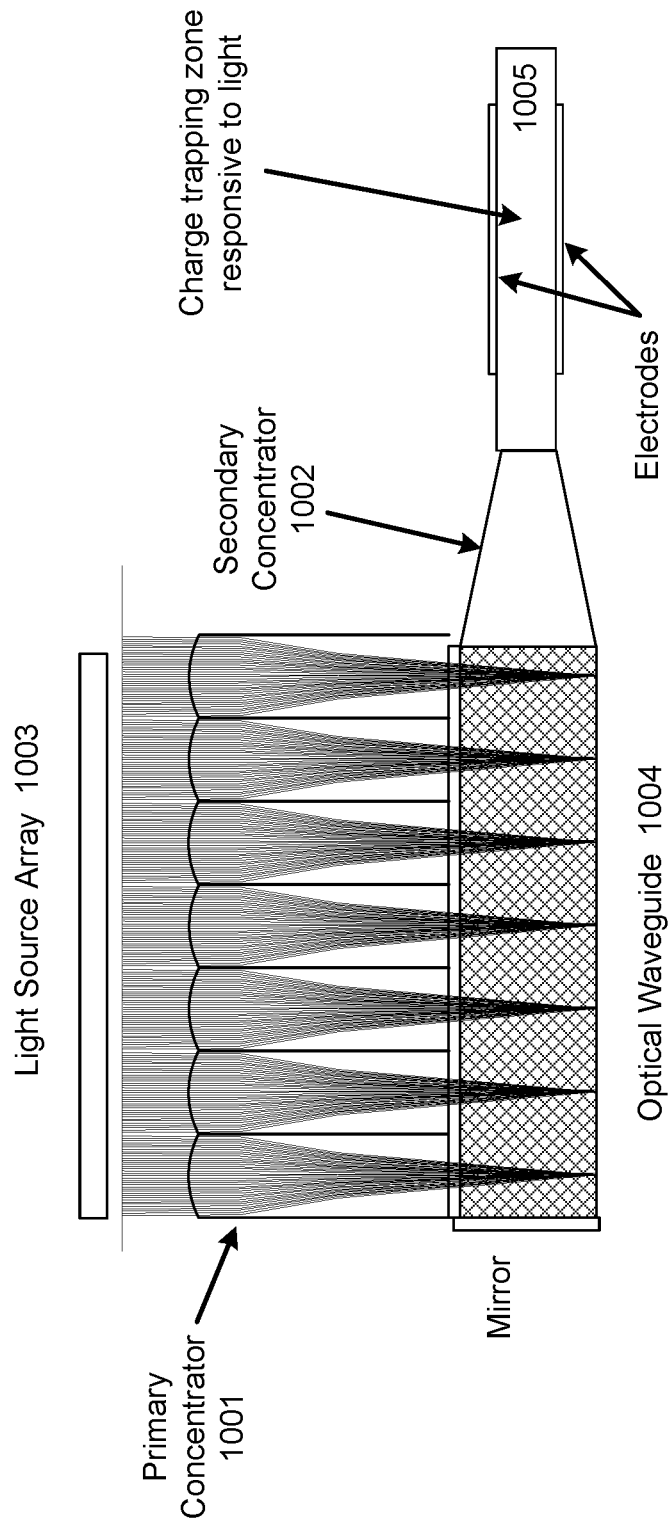
FIG. 10 shows an exemplary scheme implemented using one more concentrators.

Geometries shown in configurations (a)-(c) of FIG. 9 have sharp corners at the facet intersections. These corners can be detrimental to maintaining low electric fields. As a result, the voltage capability of the device may be limited. Thus, it is desirable to maximize the number of facets so as to approach a smooth curve such as shown in geometries (d)-(e). Geometry (d) is of a special type that can allow a waveguide and/or concentrator structure to be abutted to the flat face. FIG. 10 shows an exemplary scheme implemented using one more concentrators (1001, 1002) with a waveguide 1004. The primary purpose of the concentrators (1001, 1002) is to achieve between a 500-1000 intensity gain on the charge trapping volume responsive to radiation facet. In this particular approach, using the primary concentrator 1001 (e.g., lenslets), a broad beam light source array 1003 is focused on multiple spots on the opposite side of an optical waveguide 1004. The optical waveguide 1004 is positioned close to a secondary light concentrator 1002, if necessary. The waveguide 1004 then directs the light into the material 1005 in various configurations, e.g., such as shown in FIGS. 9A-9D. This way, the broad light source 1003 can be confined to the waveguide 1004 with much more narrow dimensions. By concentrating and collimating the light with rectangular lenses for instance, the configuration of FIG. 9E may also be useful.

To ensure a good absorption length, it is desirable that the light source emits light that has a wavelength longer than a wavelength corresponding to the bandgap:

$$\lambda = \frac{hc}{E}$$

(e.g., about 3.0 eV or 413 nm equivalent for 6H—SiC), where h is Plank's constant, c is the speed of light, and E is the bandgap energy. This criteria also ensures that the number of internal reflections are sufficient to randomize the light rays while minimizing the total losses resulting from each reflection at the facets. As a result, efficient bulk conduction in the entire charge trapping volume responsive to radiation can occur uniformly in synchronization with the controlling light source intensity.

Figure 11:
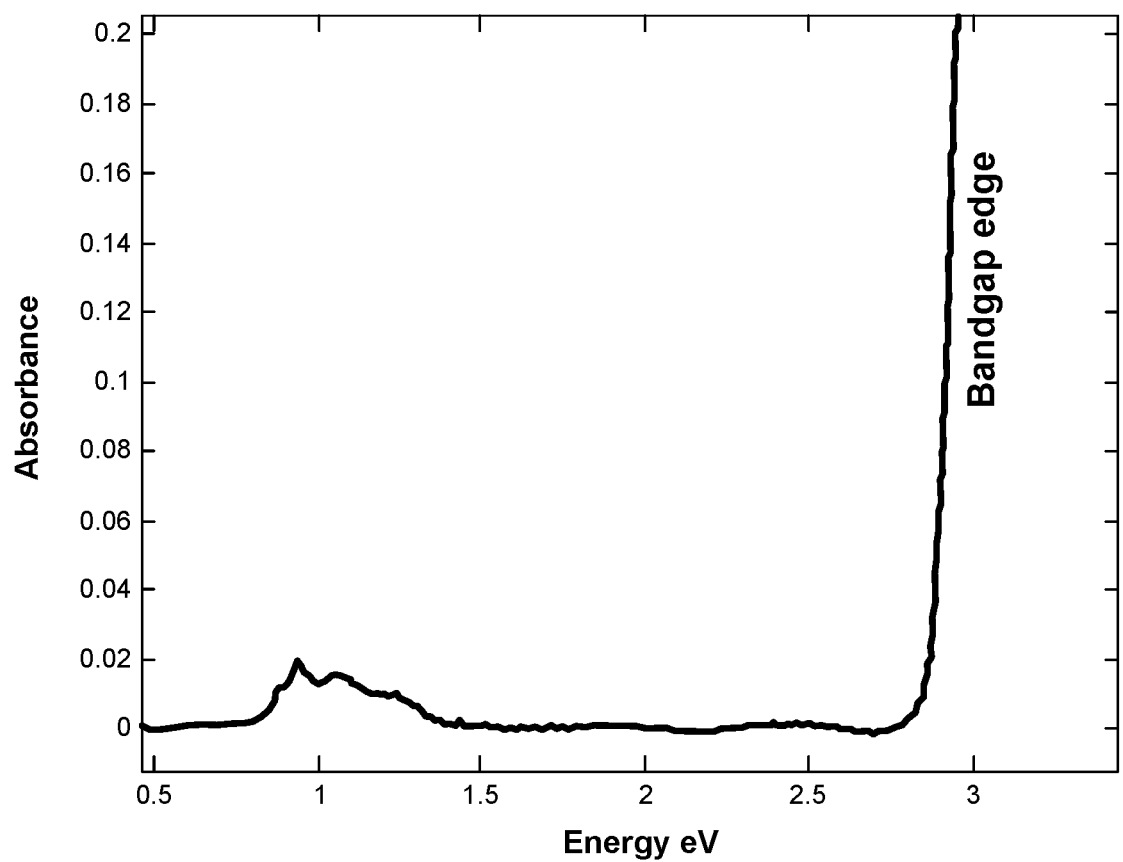
FIG. 11 shows an exemplary absorption curve.

FIG. 11 shows an exemplary absorption curve. The ideal wavelength according to the above criteria is at approximately 2.79 eV or 445 nm. For example, one possible light source, a deep blue laser diode emitting at 445 nm, is readily available commercially and is useful for this purpose. At this wavelength, the absorption depth is approximately ten times less than the plateau region between approximately 1.5 eV (or 826 nm) and 2.5 eV (or 496 nm). Although it is possible to operate the device at wavelengths longer than 1.5 eV, specialized optics can make the device more complex.

Heat Dissipation

Many base materials for the photoconductive devices that form the charge trapping region responsive to radiation can be wide band gap materials such as slightly doped silicon carbide. Materials such as silicon carbide are advantageous since it can conduct away significant amounts of power. Even then, heat dissipation requirements can still be substantial (for example, greater than 10 kW-cm$^{-2}$). Because state-of-the art cooling technologies generally have a capacity of about 27 kW-cm$^{-2}$, some additional cooling techniques may be necessary to remove the heat from the device. Both conductive and convective means can be utilized, but it is desirable to reduce the heat flux to a lower value so that a more conventional means can be implemented.

In some embodiments, the cooling techniques can be implemented as follows. First the charge trapping volume responsive to radiation is connected to a metalized substrate via an interface bond. The metalized substrate acts as a heat spreader. The metalized substrate is then connected to a base plate via another interface bond. This arrangement allows for the flow of heat out of the material to a larger area external to the charge trapping volume responsive to radiation. In some embodiments, when the heat flux is reduced by the heat spreader, a second plate can be used to interface to more conventional cooling schemes.

It is important that the coefficient of thermal expansion (CTE) between materials are matched to minimize mechanical stress and potential defect creation. For instance, with silicon carbide, a reasonable match includes materials with a CTE of approximately 4 ppm/° K. However, in some implementations, an exact match of CTE and other desirable characteristics such as thermal conductivity may not be achieved. Therefore, it is desirable to use a more resilient interface bond and/or to grade the CTE between the layers. Alternatively, one or more highly conductive layers can be inserted between the photoconductive material, the metalized substrate, and the base plate to lessen the intermediate CTE gradients along the full stack-up.

In some embodiments, the metalized substrate may include metalized diamond, direct bonded copper over aluminum oxide, aluminum nitride, silver-chemical vapor deposition diamond (CVD), aluminum-CVD, or copper-CVD. Alternatively, the metalized substrate may include a combination of heat pipes embedded into composite aluminum silicon carbide.

The composition of the base plate can include, (a) metal, metal alloy or metal matrix, (b) heat pipes (e.g., a vacuum sealed tube containing a phase change coolant and wick), (c) metal, metal alloy, or metal matrix with embedded heat pipes, (d) vapor chamber (e.g., a flat vacuum sealed chamber with phase change coolant and wick), (e) metal, metal alloy or metal matrix with integrated channels for liquid coolant flow without phase change, and/or (f) metal, metal alloy, metal matrix or ceramic with integrated channels for coolant flow with phase change.

Relatively resilient interface bond material, which helps minimize thermal expansion while maintaining relatively high heat conductivity, can include alloys such 96.5% tin, 3% silver, and 0.5% copper. In some embodiments, the bond material includes an SAC 305 alloy. Other materials such as sintered silver, carbon nanotube foil, thermoplastic adhesive, or thermoplastic with embedded fibers can also provide reasonable functionality.

Figure 12:
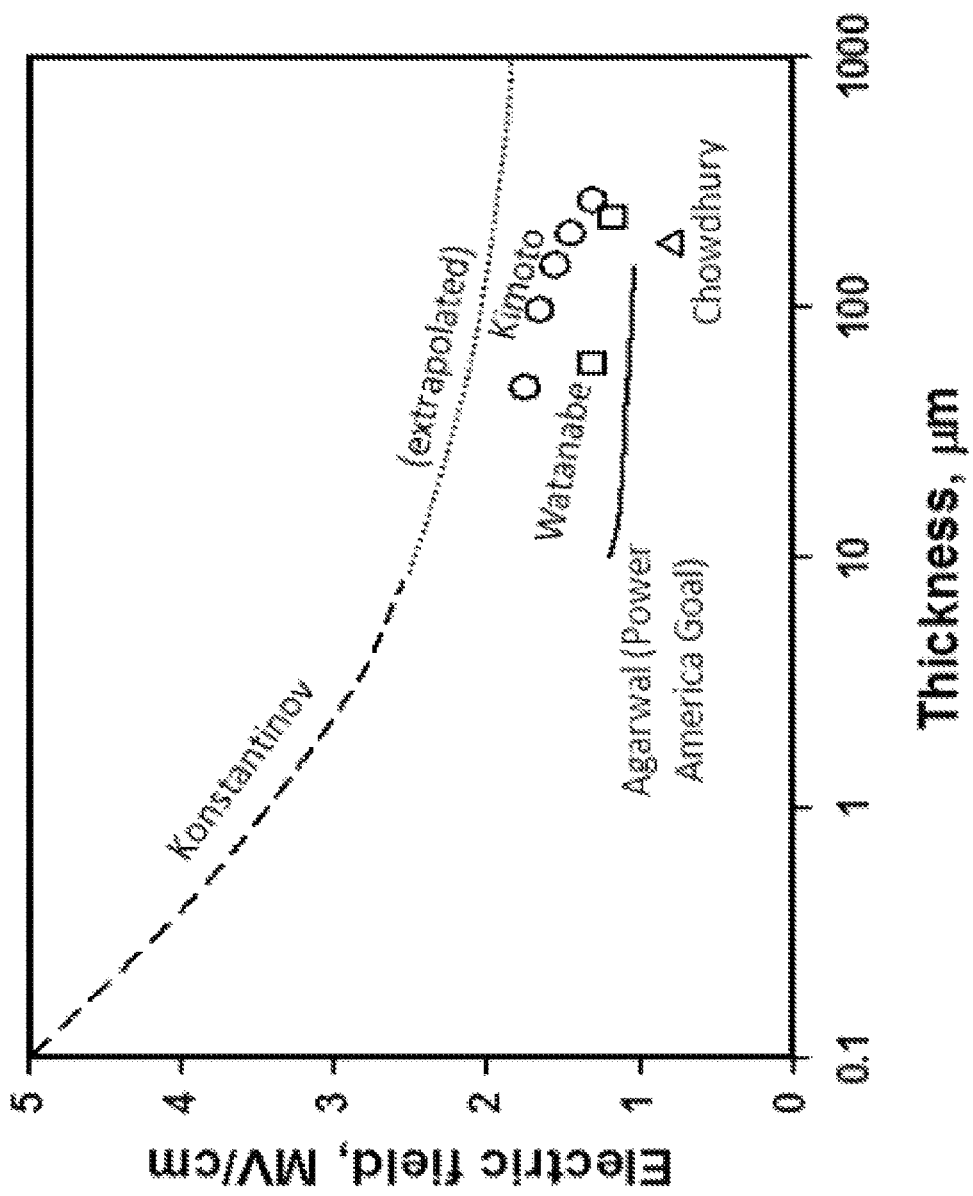
FIG. 12 shows exemplary electric field data as a function of substrate thickness in previous studies.

Finally, efficient forward transfer properties require minimizing the optical power requirements for a given total on resistance. It is therefore desirable to minimize the thickness of the material. Minimizing the material thickness increases the electric field requirements. Fortunately, there is a significant amount of data on the breakdown of materials suitable for the charge trapping volume responsive to radiation. For instance, SiC has been shown to have an ultimate breakdown strength of 2.4-5.0 MV/cm for thin material. FIG. 12 shows exemplary electric field data as a function of substrate thickness in previous studies.

In some embodiments, a lateral pumping approach is used for the crystalline material. This approach requires that the electrodes extend to the edge of the material to prevent the accumulation of trapped charge. Although this approach is far more efficient optically, it is weak for surface flashover since the entirety of the applied switch voltage is applied to the thin edge. As a result, this approach can typically achieve only 160 kV/cm in oil before surface flashover occurs. This level is only about 20% of the working electric field in conservatively designed devices. For a substrate thickness of typically about 375 μm, this approach can only enable a 6 kV device insulated by oil. Therefore, another means of insulating the device is necessary.

Materials, such as polyimide film, which have strong adhesion characteristics, are very conformal to surfaces. Some of the materials are rated to temperatures as high as 400° C. Further, such materials may have a very high breakdown strength (e.g., 1.5 to 2.2 MV/cm for 125 μm polymide films) when the voltage was DC, pulsed, or stepped. This breakdown strength is comparable to that of SiC. Further, polyimide has also shown excellent long term robustness in accelerated testing that included adhesion tests to 40,000 hours with SiC. Polyimide is also sufficiently transparent to act as an interface bond at the optical input, and is robust under high peak power laser intensity.

Unfortunately, breakdown of polyimide does not scale linearly with thickness. For instance, 375 μm polyimide films are not capable of the same breakdown electric field as the 125 μm films. It is known, however, that near theoretical breakdown strength can be achieved by individually layering dielectrics. The physical explanation of this phenomena is that layering modifies the preferential direction of a destructive arc discharge to be parallel with the layers rather than parallel to the applied electric field. Thus, in some embodiment, the insulating material is a multi-layer polyimide stack bonded to the 375 μm thick edge and bonded to the substrate on all sides.

A multilayer polyimide film can be deposited by a number of methods. For instance, a spin application technique can be used where the film thickness is defined by the rotational speed of the part and viscosity of the polyimide solution. Multi-layering perpendicular to the thin edge is done by allowing the film to partially dry after each coat so that an electrically strong film that is well bonded to the substrate and between layers result. In some embodiments, 3D printing technique can also be used to deposit the multilayer polyimide film.

It is noted that while polyimide is discussed here, there are other polymers that are well developed and used widely as a conformal coat at microcircuit levels and in nanoscale technologies.

Figure 13:
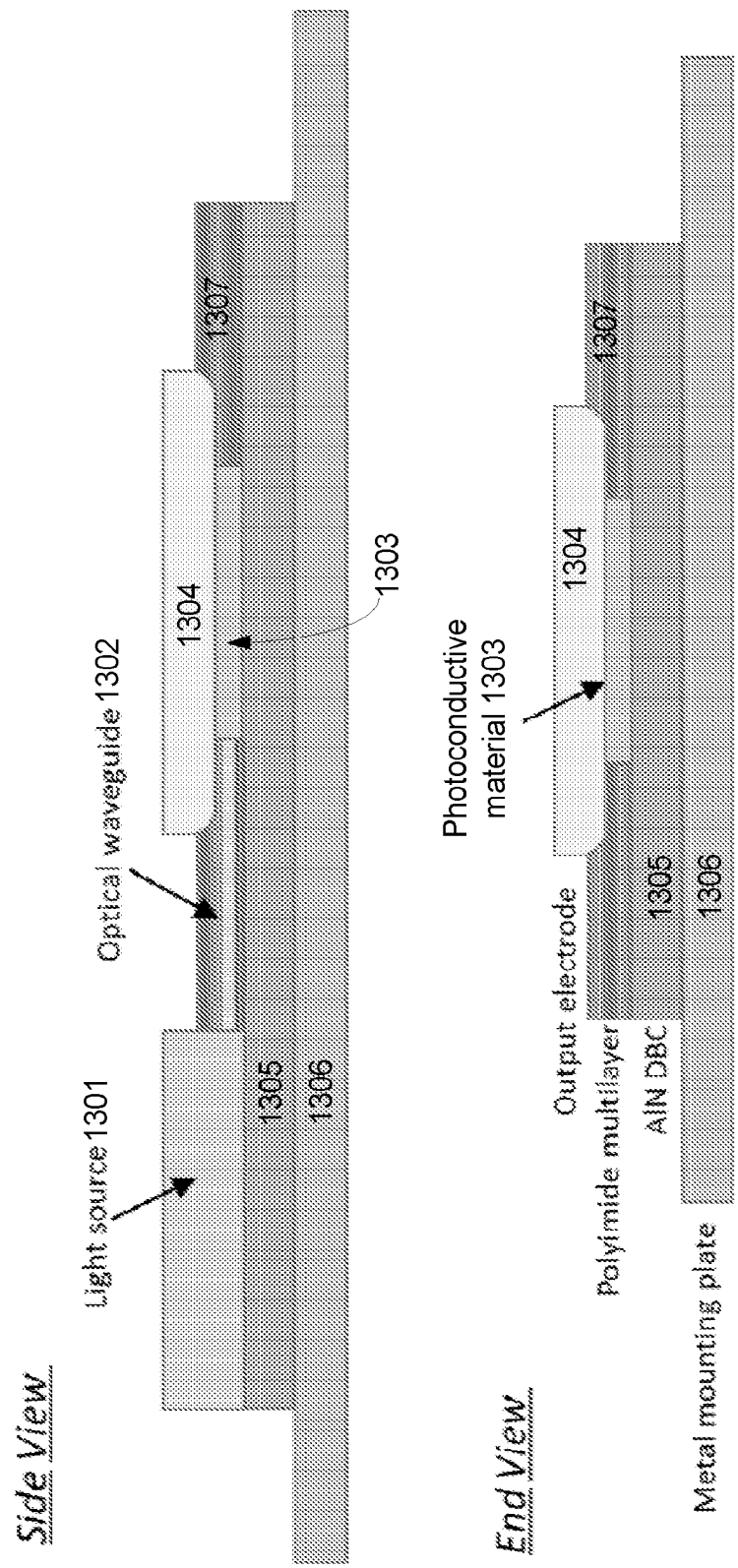
FIG. 13 shows a schematic diagram of a side view and an end view of an exemplary embodiment of a photoconductive device in accordance with the present technology.

FIG. 13 shows a schematic diagram of a side view and an end view of an exemplary embodiment of a photoconductive device 1300 in accordance with the present technology. The device includes a light source 1301 to emit light into a photoconductive material 1303. In some embodiments, the device 1300 includes an optical waveguide 1302 to guide the light into the photoconductive material 1303. The photoconductive material 1303 is coupled to an output electrode 1304. In response to the incoming light, the photoconductive material 1303 demonstrates a linear transconductance-like property.

In some embodiments, the two large faces of the photoconductive material 1303 are coated with highly reflective metalized multilayer coating topped with an inert gold layer top layer to prevent oxidation. The whole of the photoconductive material 1303 functions as a Schottky contact with a very limited amount of intentional silicide formation. One exemplary coating process is radio frequency sputtering with a multi-magnetron gun sputter system. The photoconductive material 1303 remains under a protective low pressure gas barrier until the inert gold layer is applied as the final coating. After the metallic coating is complete, the photoconductive material 1303 is wax blocked together to form a semi-rectangular or a cylindrical bar. In some implementations, dummy substrates are used on each end of the bar to protect the end metalized surface. Each face of the bar is then be lapped to remove excess metal and polish the thin faces. After polishing, the photoconductive material 1303 is coated with a multilayer, high reflectivity, dielectric coating.

In some embodiments, the photoconductive material 1303 is bonded to a metalized substrate 1305 (e.g., AlN-DBC) on the lower face to function as a heat spreader, such as shown in the "End View." Additional heat spreaders can be placed between the photoconductive material 1303 and the metalized substrate 1305, or the metalized substrate 1305 and the base plate 1306 (e.g., a metal mounting plate). The additional heat spreaders may act in part as heat spreaders and in part as a CTE matching interface. The base plate 1306 can provide direct compatibility with an existing IGBT or high voltage power MOSFET modules. In some embodiments, the metalized substrate 1305 (e.g., AlN-DBC layer) also carries the light source packaging 1301 and the optical waveguide 1302.

In some embodiments, the photoconductive material 1303 may also be surrounded by an insulating layer 1307. In some embodiments, application of the insulating layer 1307 (e.g., polyimide film) is done with a spin coater; as mentioned above, and multi-layering is done by allowing each coat to dry sufficiently so that a distinct boundary is formed.

In some implementations, the output electrode 1304 is attached with a solder melting point compatible with the insulating layer 1307. Such lead free solders include alloys of tin, silver, and antimony which have a melting point range up to 395° C. These solders can also be used for die attach of the electrode 1304. After all these processes are complete, the entirety of the device can be potted in a high electrical strength epoxy or similar material and enclosed in a polybutylene terephthalate case.

It is thus evident that the bulk conduction approach disclosed herein enables an improved photoconductive device. The improved device exhibits a linear transconductance like-property, limited primarily by the recombination time of the photoconductive material. This improved device incurs significantly lower transition losses as compared to a standard junction device, and can be connected to resistors, capacitors, inductors, or other circuit elements to form a circuit for a particular function so as to replace the functionality of junction semiconductor device.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A photoconductive apparatus, comprising:
   a crystalline material positioned to receive light from a light source, the crystalline material comprising a bulk material doped with a dopant at a predetermined concentration level to form mid-gap levels below a conduction band of the crystalline material as carrier traps, the predetermined concentration level causing a recombination time associated with the crystalline material to be at least one order of magnitude smaller than a time of a signal that is applied to generate the light from the light source such that the crystalline material exhibits a linear transconductance in response to the light from the light source; and
   a pair of electrodes coupled to the crystalline material and configured to allow an electric field to be established across the crystalline material.

2. The photoconductive apparatus of claim 1, wherein the linear transconductance is defined based on a generated current in the photoconductive apparatus in response to a light intensity of the light from the light source.

3. The photoconductive apparatus of claim 1, wherein the recombination time of the crystalline material is in an order of 1 nanosecond and wherein the time of the applied signal is in an order of 10 nanoseconds.

4. The photoconductive apparatus of claim 1, wherein the predetermined concentration level is below $7.0 \times 10^{15}$ cm$^{-3}$ and above $1.8 \times 10^{15}$ cm$^{-3}$.

5. The photoconductive apparatus of claim 1, wherein the crystalline material comprises silicon carbide.

6. The photoconductive apparatus of claim 1, wherein the predetermined concentration level produces a linear carrier decay time without a plateau with a single time constant that dominates carrier recombination process.

7. The photoconductive apparatus of claim 1, wherein the dopant includes one of: vanadium, nitrogen, aluminum, or boron.

8. The photoconductive apparatus of claim 1, wherein the crystalline material includes a first facet on a first end to allow the light to enter the crystalline material, and a second facet on an opposite end that is oblique with respect to a path of the light that enters the crystalline material.

9. The photoconductive apparatus of claim 1, wherein the crystalline material has a curved surface.

10. The photoconductive apparatus of claim 1, further comprising:
    a reflective coating on the crystalline material to allow the light to reflect within the crystalline material.

11. The photoconductive apparatus of claim 1, wherein a wavelength of the light is 445 nm upon a bandgap of the crystalline material being around 3.0 eV.

12. A photoconductive device, comprising:
    a light source configured to emit light under a control of a pulse signal;
    a crystalline material positioned to receive the light from the light source, wherein the crystalline material is doped with a dopant having a concentration of a predetermined value to form mid-gap levels below a conduction band of the crystalline material as carrier traps, the predetermined value causing a recombination time of the crystalline material to be at least one order of magnitude smaller than a time of a signal that is applied to emit the light from the light source such that the crystalline material exhibits a linear carrier decay in response to the light from the light source;
    a first electrode coupled to the crystalline material to provide a first electrical contact for the crystalline material, and
    a second electrode coupled to the crystalline material to provide a second electrical contact for the crystalline material, wherein the first electrode and the second electrode are configured to establish an electric field across the crystalline material.

13. The photoconductive device of claim 12, wherein the recombination time of the crystalline material is in an order of 1 nanosecond and wherein the time of the applied signal in an order of 10 nanoseconds.

14. The photoconductive device of claim 12, wherein the predetermined value of the concentration is below $7.0 \times 10^{15}$ cm$^{-3}$ and above $1.8 \times 10^{15}$ cm$^{-3}$.

15. The photoconductive device of claim 12, wherein the crystalline material comprises silicon carbide, and wherein the dopant includes one of: vanadium, nitrogen, aluminum, or boron.

16. The photoconductive device of claim 12, wherein the crystalline material comprises 6H—SiC, and wherein a wavelength of the light is greater than 413 nm.

17. The photoconductive device of claim 12, further comprising:
- an optical waveguide positioned in a path of the light between the light source and the crystalline material to direct the light from the light source to the crystalline material.

18. The photoconductive device of claim 12, wherein the first electrode is formed as a base plate that includes one of a metal, a metal alloy, or a metal matrix, and wherein the photoconductive device further comprises:
- a metalized substrate positioned between the crystalline material and the base plate to spread heat generated by the crystalline material when excited by the light.

19. The photoconductive device of claim 18, further comprising a bond material positioned between the metalized substrate and the crystalline material, or between the metalized substrate and the first electrode, to reduce gradients of coefficients of thermal expansion between the metalized substrate and the crystalline material, or between the metalized substrate and the base plate.

20. The photoconductive device of claim 12, wherein wavelength of the light is 445 nm upon a bandgap of the crystalline material being around 3.0 eV.

21. The photoconductive device of claim 12, wherein a wavelength of the light that enters the crystalline material is longer than a wavelength corresponding to a bandgap of the crystalline material.

* * * * *